United States Patent
Keating, I et al.

(10) Patent No.: US 9,851,407 B2
(45) Date of Patent: Dec. 26, 2017

(54) SELF HEATING HEATER

(71) Applicant: ICC-Nexergy, Inc., Westchester, IL (US)

(72) Inventors: Joseph Keating, I, Broomfield, CO (US); Chris Turner, Dublin, OH (US); Robert F. Wentink, Reno, NV (US); Tai-Guang Huang, Guangzhou (CN)

(73) Assignee: ICC-NEXERGY, INC., Westchester, IL (US)

( * ) Notice: Subject to any disclaimer, the term of this patent is extended or adjusted under 35 U.S.C. 154(b) by 20 days.

(21) Appl. No.: 14/703,387

(22) Filed: May 4, 2015

(65) Prior Publication Data
US 2015/0318589 A1    Nov. 5, 2015

Related U.S. Application Data

(60) Provisional application No. 61/987,904, filed on May 2, 2014.

(51) Int. Cl.
| | |
|---|---|
| *H01M 10/6571* | (2014.01) |
| *G01R 31/36* | (2006.01) |
| *H02J 7/00* | (2006.01) |
| *H01M 10/46* | (2006.01) |
| *H01M 10/48* | (2006.01) |

(52) U.S. Cl.
CPC .......... *G01R 31/36* (2013.01); *G01R 31/361* (2013.01); *G01R 31/3675* (2013.01); *H01M 10/46* (2013.01); *H01M 10/482* (2013.01); *H01M 10/486* (2013.01); *H01M 10/6571* (2015.04); *H02J 7/007* (2013.01); *H02J 7/0013* (2013.01);
(Continued)

(58) Field of Classification Search
CPC .......... H01M 10/6571; H01M 2220/10; H02J 7/0013; G01R 31/361; G01R 31/3675
USPC ....................................................... 320/150
See application file for complete search history.

(56) References Cited

U.S. PATENT DOCUMENTS

| | | |
|---|---|---|
| 4,081,737 A | 3/1978 | Miyahara |
| 4,926,106 A | 5/1990 | Tanis |

(Continued)

*Primary Examiner* — Sun Lin
(74) *Attorney, Agent, or Firm* — Clark Hill PLC; John S. Paniaguas (57) ABSTRACT

The invention relates to a power management system for supplying backup DC power to peak and/or high current demand battery applications, such as motor starting or an uninterruptible power supply (UPS) used to power a critical load, such as, a data bus or other critical load, after an event, such as loss of primary AC or DC input, during relatively cold ambient temperatures. Two or more heaters can be provided; for example, a low power heater and a high-power heater. In a maintenance mode, the low power heater is used to maintain batteries at a predetermined temperature. In this mode, a battery charger is used to power the low power heater. In a boost mode, after the primary AC or DC input is restored, and battery temperature is too low to back up the critical load, the battery charger supplies power to one or both of the heaters. Since capacity of the battery charger is normally insufficient to heat the batteries to an acceptable operating temperature in a relatively short period of time, a portion of residual power from the batteries is used to boost power to the heaters in order to speed up the time to get each battery of said batteries to its rated operating temperature.

10 Claims, 7 Drawing Sheets

(52) U.S. Cl.
CPC .... *H01M 2220/10* (2013.01); *Y10T 29/49005* (2015.01); *Y10T 307/344* (2015.04)

(56) References Cited

U.S. PATENT DOCUMENTS

| | | | | |
|---|---|---|---|---|
| 5,721,688 | A * | 2/1998 | Bramwell | H02J 7/0093 320/128 |
| 5,751,136 | A | 5/1998 | Takechi et al. | |
| 6,002,240 | A | 12/1999 | McMahan et al. | |
| 8,013,600 | B1 * | 9/2011 | Yepez et al. | G01N 27/9033 324/240 |
| 8,092,936 | B2 * | 1/2012 | Xiankai et al. | H01M 10/615 180/65.31 |
| 8,276,695 | B2 * | 10/2012 | Han et al. | H01M 2/04 180/65.31 |
| 8,383,257 | B2 * | 2/2013 | Lai et al. | H01M 10/615 429/53 |
| 8,420,254 | B2 * | 4/2013 | Zhu et al. | H01M 2/04 429/175 |
| 9,236,748 | B2 * | 1/2016 | Barsukov et al. | H02J 7/00 |
| 2006/0110657 | A1 | 5/2006 | Stanton et al. | |
| 2009/0139781 | A1 * | 6/2009 | Straubel | B60L 11/1875 180/65.1 |
| 2012/0249284 | A1 | 10/2012 | Almquist et al. | |
| 2014/0114519 | A1 * | 4/2014 | Iwama et al. | H01M 4/485 701/22 |
| 2014/0120417 | A1 * | 5/2014 | Matsushita et al. | H01M 4/667 429/211 |
| 2014/0162132 | A1 * | 6/2014 | Ishii et al. | H01M 4/525 429/231.95 |
| 2015/0004464 | A1 * | 1/2015 | Okuno et al. | H01M 2/18 429/143 |

\* cited by examiner

| Heater film | Ambient | Power | battery tem rise (SMBUS) | Cell tem rise (logger) |
|---|---|---|---|---|
| heater | 0°C | 30W | 23.35°C@90min | 26.12°C of cell 6 @4h |
| heater | 0°C | 45W | 34.05°C@90min | 32.5°C of cell 4 @90min |
| heater | 0°C | 200W | 30°C@5.95min<br>40.2°C@8.21min<br>50°C@10.68min | 30.12°C@6.33min<br>40.09°C@8.83min<br>50.09°C@11.67min of cell4 |
| heater | 0°C | 220W | 30.95°C@5.67min<br>40.05°C@7.5min<br>50.05°C@9.67min | 30.14°C@5.67min<br>40.46°C@7.83min<br>50.64°C@10.17min of cell4 |

Fig. 6

SELF HEATING HEATER

CROSS REFERENCE TO RELATED APPLICATIONS

This application is related to and claims the benefit of U.S. Provisional Patent Application No. 61/987,904, filed on May 2, 2014, hereby incorporated by reference.

BACKGROUND OF THE INVENTION

1. Field of the Invention

The invention relates to a power management system for enabling back-up batteries to supply peak and/or high current demand DC loads, such as DC motor starting or an uninterruptible power supply (UPS) used to power a critical load, such as, a data bus or other critical load after an event, such as a loss of primary AC or DC power, during relatively cold ambient temperatures. The power management system includes one or more heaters, for example, a low power heater and a high power heater. In a maintenance mode, when the data bus or other critical load is fed from a primary power source, the low power heater is used to maintain the battery packs at a predetermined temperature, such as the desired operating temperature, so that the batteries can provide their minimum required capability upon loss of the primary power source. In this mode, the battery charger powers the low power heater and also maintains the charge on the batteries. After an event, such as a loss of the primary power source, the battery temperature can become too low to enable the batteries to provide the required capacity to back up the critical load. During such a condition, the battery charger supplies power to one or both of the heaters as well as to the batteries. Since the capacity of the battery charger is normally insufficient to heat the batteries to an acceptable operating temperature in a relatively short period of time during such a condition, a portion of the residual power in the battery is used to boost the power to one or both of the heaters in order to speed up the time to get the battery to normal operating temperature.

2. Description of the Prior Art

Conventional systems which supply electrical power to critical loads, such as data buses or other critical loads, are known to be powered from an uninterruptible power system (UPS). Such UPS systems utilize a primary AC or DC power supply and a DC back-up power supply. Critical loads, such as data buses, are known to require DC power. As such, during normal operation, the AC power from the primary AC power supply is converted to DC by way of a converter and supplied to the critical load. Because of the criticality of the load, a back-up DC power supply is also selectively connectable to the critical load in the event of loss of the primary AC power supply.

It is important that the DC back-up power supply be maintained at virtually full capability at all times. Unfortunately, some back-up battery systems may be exposed to relatively cold ambient conditions after a loss of the primary power source. Depending on the ambient temperature, the back-up battery system may not be able to deliver full capacity DC current to the critical load. The reason for this is that the internal resistance/impedance of the battery is inversely proportional to the temperature of the battery. Thus, the internal resistance of the battery will be relatively high at relatively low temperatures preventing the battery from delivering its full capacity. In addition, as batteries age, the internal resistance of the batteries tends to increase causing the battery to provide less output current and capacity.

Because of the criticality of the load, different schemes have been provided to heat-up the back-up battery system when exposed to relatively cold ambient temperatures after a loss of the primary power source. Unfortunately, the primary power source can be unavailable for some period of time. During that time, the temperature of the battery can drop to a relatively low level. Once the primary power source becomes available, it is necessary that the battery capacity be sufficient to safely shut down the critical after a subsequent power loss, the required capacity. As such, the batteries are normally heated by the battery charger to a temperature that enables the batteries to deliver their rated capability. Unfortunately, the capacity of battery chargers in known systems do not have sufficient capacity to heat the batteries quickly. As such, the critical load must remain off-line until the batteries are heated to the desired operating temperature. Thus, there is a need to provide a system for heating up a battery to a temperature at which it can deliver its required current and capacity in a relatively short time in order to minimize the exposure of the critical load to a total loss of electrical power during a loss of the primary AC power system. There is also a need for compensating aging batteries so that such batteries provide a relatively constant performance over time,

SUMMARY OF THE INVENTION

The invention relates to a power management system for enabling back-up batteries to supply peak and/or high current demand DC critical loads, for example, a data bus or other critical load after an event, such as a loss of primary AC or DC power, during relatively cold ambient temperatures. The power management system includes one or more heaters, for example, a low power heater and a high power heater. In a maintenance mode, when the data bus or other critical load is fed from a primary power source, the low power heater is used to maintain the battery at a predetermined, desired operating temperature so that the batteries can provide their required capacity upon loss of the primary power source. In this mode, the battery charger is used to power the low power heater as well as maintain the charge on the batteries. In a boost mode, it is assumed that the battery charger is available and the battery temperature is too low to back up the critical load. During this mode, the battery charger supplies power to the high power heater. Since the capacity of the battery charger is normally insufficient to heat the batteries to an desired operating temperature in a relatively short period of time, a portion of the residual power in the battery is used to boost the power to the high power heater in order to speed up the time to get the battery to normal operating temperature.

DESCRIPTION OF THE DRAWING

These and other advantages of the present invention will be readily understood with reference to the following specification and attached drawing wherein.

DETAILED DESCRIPTION

The invention is part of an uninterruptible power system used to provide continuous power to a critical load, such as, a data bus during loss of AC or DC power. In particular, the invention relates to a power management system 20 which relies on residual current from the batteries in addition to power from a battery charger to heat batteries to their desired operating temperature, as well as charge the batteries 40, after the batteries have been exposed to relatively low temperature conditions after an event, such as a loss of the primary AC or DC input 42. In particular, the batteries 40 are used to back up a critical load 38 in the event of loss of the primary AC or DC. In order for the batteries 40 to provide enough power to safely shut down a critical load 38, such as a data bus, after an event, such as a loss of the primary AC or DC input 42, the batteries 40 must be fully charged and at their desired operating temperature. As such, the power management system 20 measures the battery state of charge and the battery temperature and allows the primary AC or DC input 38 to be reconnected to the load 38 when the batteries are charged to the required capacity and the batteries are at the desired operating temperature.

The battery temperature is sensed by a temperature sensor 43. The temperature sensor 43, for example, a thermistor, thermocouple or other temperature sensor senses the ambient temperature in the vicinity of the batteries 40 and transmits a signal back to the computing device 22.

The state of charge of the battery may be determined by the charging current and the voltage. In particular, the charging current is sensed by a current sensing resistor 39 which measures the charge current supplied to the batteries 40. The voltage of the batteries 40 is also sensed. This information is provided to the computing device 22 which can determine the state of charge of the batteries 40 from the charging current and voltage of the batteries 40. As such, the computing device 22 can determine when the batteries 40 are charged to the required capacity and when the batteries are up to their desired operating temperature in order to reconnect the primary AC or DC input to the load 38.

Assuming a condition when the batteries are exposed to extremely cold ambient temperatures, for example, 0° C., after an event, such as a loss of the primary AC or DC input 42, it is necessary that the batteries 40 be fully charged and heated to the desired operating temperature, after the primary power is restored but before the primary AC or DC input can be reconnected to the critical load. Otherwise, the batteries 40 would not be able to supply sufficient power to the critical load during a subsequent loss of the primary AC or DC input 42.

As such, when the primary AC or DC power is restored, it is important to get the batteries 40 to their desired operating temperature so that they can provide sufficient power to the critical load so that the battery can be available to reconnect to the critical load 38 as soon as possible. In addition, the batteries 40 need to be maintained at their desired operating temperature during all operating conditions.

In order to deal with temperature changes of the batteries 40 due to fluctuating ambient conditions, the power management system includes heaters, for example, a high power heater 24 and a low power heater 26. For example, in a maintenance mode of operation, i.e. while the primary AC or DC input 42 is connected to the load 38, the battery charger 41 provides power to the low power heater 26 as a function of the battery temperature in order to maintain the temperature of the batteries 40 at a predetermined, desired operating temperature, for example 25° C. After an event, such as loss of the primary AC or DC input 42, the temperature of the batteries can drop to a relatively low level, for example, 0° C., depending on the ambient temperature and the length of time the primary AC or DC input 42 is not available. Once the primary AC or DC input 42 is restored, the battery charge and temperature must be returned to their desired operating values. As such, during such a condition when the batteries 40 are exposed to relative low ambient temperatures, the power management system 20 enters a boost mode. In this boost mode, the batteries 40 are charged by the battery charger 41 and heated by one or both of the low power heater 26 and the high power heater 24. In particular, upon initial loss of the primary AC or DC input 42, the batteries 40 are used to safely shut down the critical load 38 resulting in the batteries 40 being partially discharged. Once the primary AC or DC input 38 is restored, the batteries 40 are charged by the battery charger 41. If the batteries 40 are also at a relatively low temperature after such an event, the battery charger 41 multitasks. In this condition battery charger 41 supplies power to the batteries 40 and one or both of the low power heaters 26 and the high power heater 24 at the same time. During this condition, the switches 32, 34 and 36 are closed to enable the battery charger 41 to power one or both of the heaters 24 and 26. In accordance with an important aspect of the invention, the power management system 20 enables residual current in the batteries 40 to boost the current being supplied to one or both of the heaters 24 and 26. In particular, in a boost mode, the switch 30 is closed. This allows power from the battery charger 41 and the batteries 40 at the same time to provide power to one or both of the heaters 24 and 26. In this configuration the switch 28 is open to isolate the batteries 40 from the load 38. However, with the switch 30 closed, the residual current of the batteries 40 back feeds the closed switch 30 in order to add to or boost the current being supplied to one or both of the heaters 24 and 26 in order to speed up the time to get the batteries 40 up to a predetermined operating temperature, for example 25° C., while charging the batteries 40.

Figure 1A:
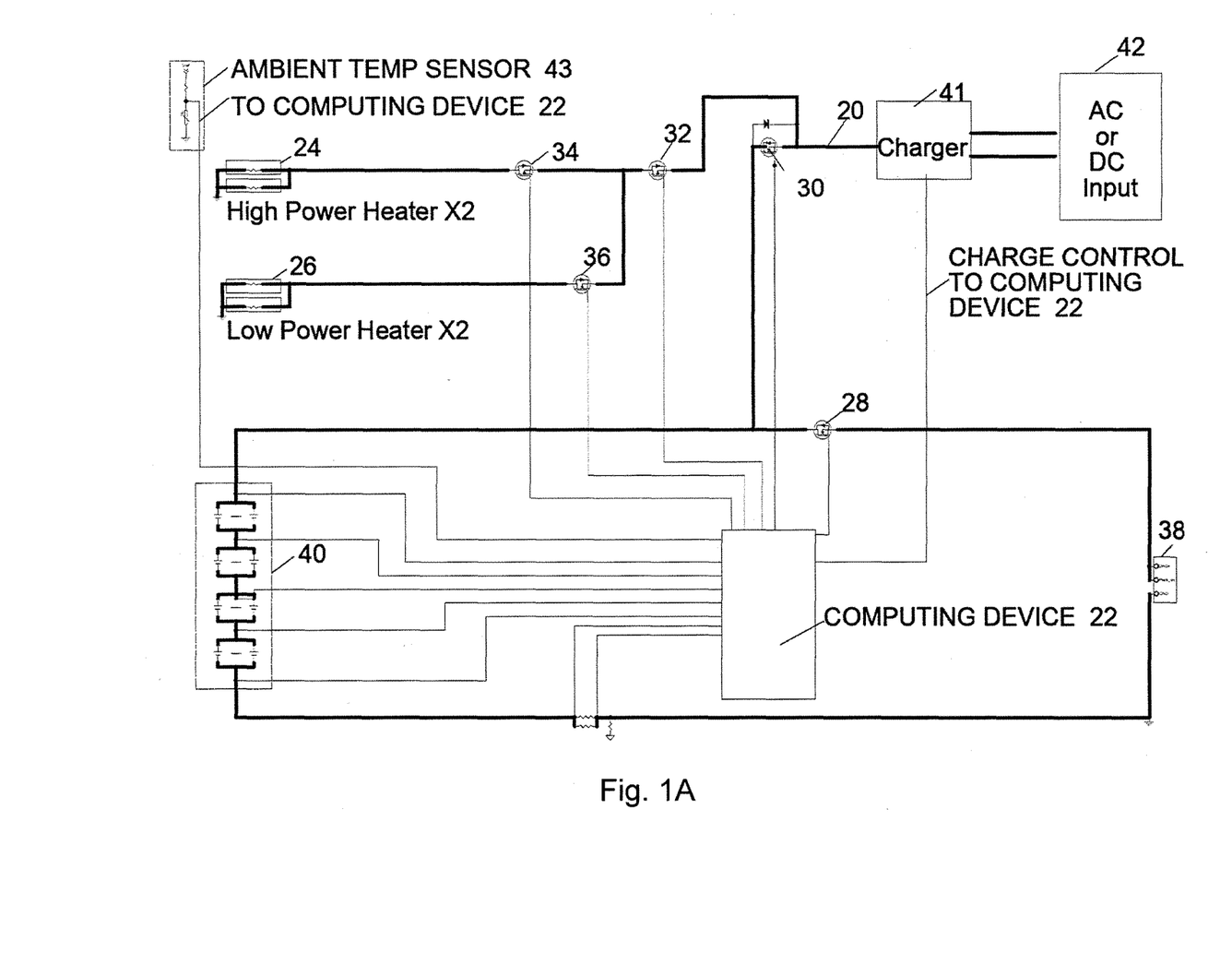
FIG. 1A is a simplified schematic diagram of the self-heating battery circuit in accordance with an aspect of the invention-shown connected to a battery charger and an external AC power input.
Figure 1B:
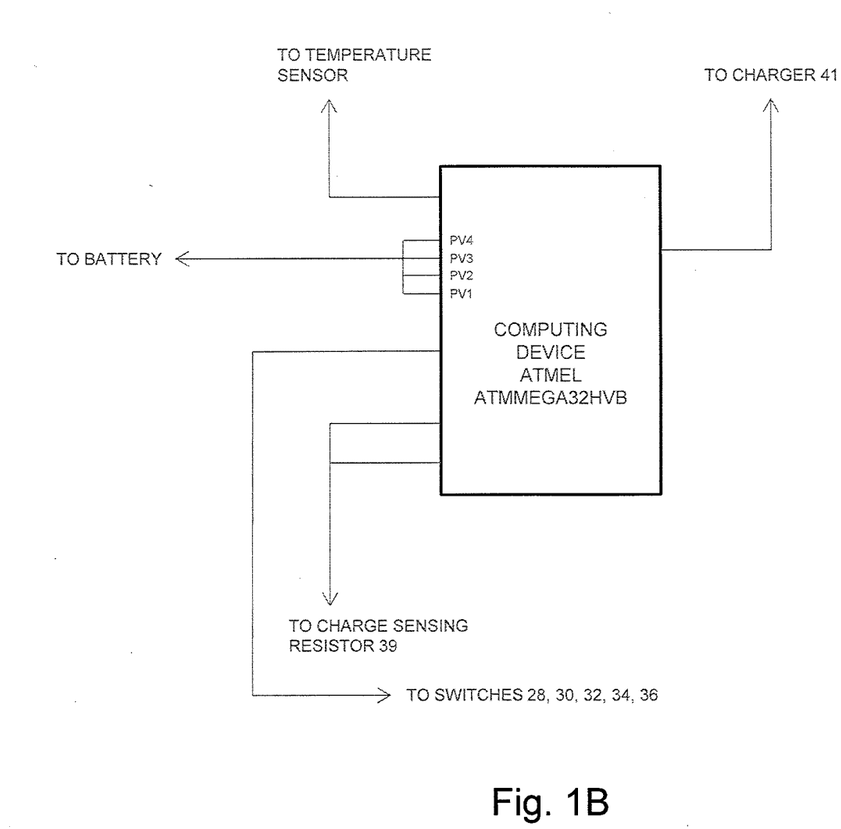
FIG. 1B is an exploded view of the computing device illustrated in FIG. 1A, shown with all its pin designations.

Referring to FIGS. 1A and 1B, the power management circuit 20 includes a computing device 22 and a number of switches which may be implemented by FETs, BJTs, relays or virtually any switching device. In the exemplary schematic illustrated in FIGS. 1A and 1B, five (5) switches 28, 30, 32, 34 and 36 are shown. These switches 28, 30, 32, 34 and 36 are controlled by the computing device 22, for example, a digital signal processor (DSP) or other computing device.

All of the various switches are controlled by the computing device 22. The operation of each of the switches is discussed below.

The switch 28 may be used to selectively connect the load, illustrated by the reference numeral 38, to the batteries 40, during a loss of the primary AC or DC input 42.

The switch 30 connects the batteries 40 to the battery charger 41. Each of the heaters 24 and 26 has its own switch 34 and 36, serially connected to the heaters 24 and 26, respectively. The switches 34 and 36 are connected to a main heater switch 32. The switch 32 is an optional safety switch, which is normally closed. In the event of failure of the switches 34 or 36 in a closed position, the switch 32 can be opened to disconnect the heaters 24 and 26 from the battery charger 41 or the batteries 40.

During a normal condition, when the primary AC or DC input 42 is available, the switch 28 is open and the load 38 is fed from an external primary source of AC or DC power (not shown). While the primary AC or DC power source is available, the computing device 22 monitors the charge of the batteries 40 by way of the Ports PV1, PV2, PV3 and PV4. Over time, the charge on the batteries 40 will dissipate. In order to keep the batteries 40 fully charged, the battery charger 41 is maintains the batteries 40 at required charge so that they are available at required capability in the event of a loss of the primary AC or DC power supply. Various battery chargers are suitable for this application. Exemplary battery charging techniques are disclosed in U.S. Pat. Nos. 8,436,583; 7,898,220; 7,683,574; 7,626,362; 7,394,225; and 7,227,337, hereby incorporated by reference.

In addition, during a maintenance mode, the temperature of the batteries 40 is monitored in order to maintain a relatively constant battery temperature, for example, 25° C. In this mode, the battery charger 41 powers the low power heater 26 to maintain the temperature of the batteries 40 to be constant. During this mode, the switch 34 is selectively closed. During a normal mode of operation, when the load 38 is being fed from the primary AC or DC power supply (not shown), the switch 28 is open which isolates the batteries 40 from the load 38. The switch 30 which selectively connects the battery charger 41 to the batteries 40 to allow the batteries 40 to be charged by the battery charger 41, as a function of the state of charge of the batteries 40.

The switches 34 and 36 are used to selectively connect the heaters 24 and 26 to the battery charger 41. The switch 32 is an optional safety switch that is normally closed and can be used in the event of failure of the switches 34 and 36 in order to disconnect the heaters 24 and 26 during such a condition. The switches 34 and 36 are selectively controlled as a function of the ambient temperature to which the batteries 40 are exposed. During a maintenance mode, as discussed above, the switch 36 is selectively controlled to allow the low power heater 24 to be powered by the battery charger 41 in order to maintain the temperature of batteries 40 to remain fairly constant at the desired operating temperature. Depending on the ambient temperature, the computing device 22 will signal the switch 34 to enable the battery charger 41 to power the low power heater 26 to maintain the batteries 40 at a desired operating temperature, for example, 25° C. Once the batteries 40 are at desired operating temperature, the switch 34 may be turned on and off under the control of the computing device 22 by way of closed loop temperature control.

In another operating mode, namely a boost mode, after a loss of the primary AC power supply and if the batteries 40 are exposed to a relatively cold ambient temperature, after a restoration of the primary AC or DC input 42, the battery charger 41 is multi-tasked. In this mode of operation, the battery charger 41 provides power to the high power heater 24 by way of the closed switches 30, 32 and 34. In accordance with the invention, in order to speed up battery heating, the residual charge in the batteries 40 is used to boost the power to the heater 26 to speed up the heating time of the batteries 40. During this boost mode, the switch 28 remains opened to isolate the batteries 40 from the load 38 until the batteries are at a predetermined, required capacity.

An exemplary battery pack 40 is shown which includes eight batteries configured as four (4) pairs of lithium ion batteries in series. Each of the four (4) exemplary pairs includes two (2) batteries in parallel. Exemplary batteries may include battery cells of the type high-rate 18650 3.6-3.7V nominal with 20-40 Ampere rate capability. Such batteries are used to back-up a nominal 12 volt DC load 38 and can collectively provide about 1-5 KW of power. Other batteries are contemplated, such as lead acid and other batteries.

In alternate embodiments, multiple heaters may be used in concert with multiple sensors located throughout the battery pack to heat different regions of the battery pack at different rates depending on the temperature. This could provide a uniform battery temperature that would help to maintain the internal charge balance, provide more uniform impedance across the pack, and improve the accuracy of pack capacity measurements. As such, multiple heater units would be controlled individually to provide localized heating to create a uniform temperature across one or multiple cells in the battery pack in the case that thermal differences or thermal gradients exist across the battery.

Figure 2:
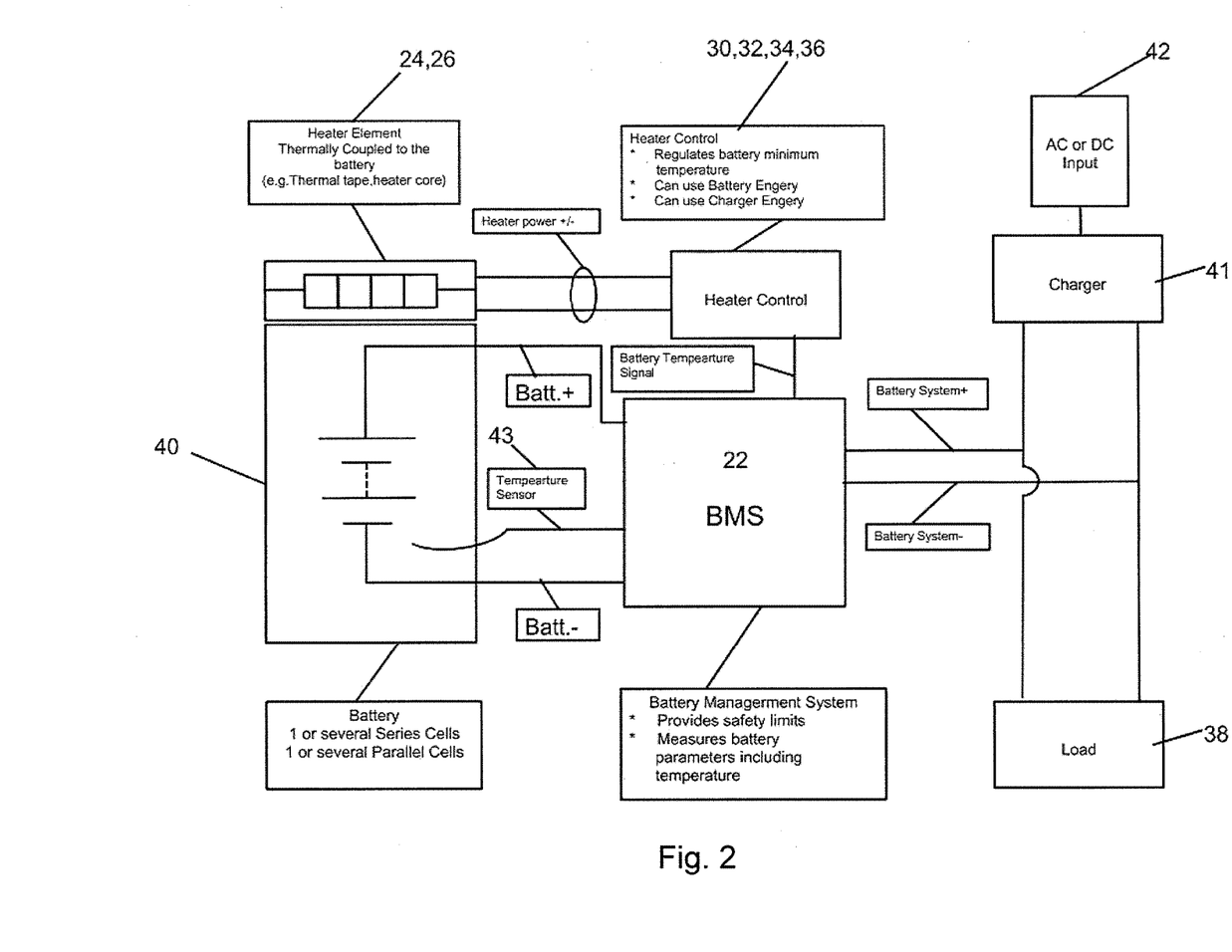
FIG. 2 is an alternative embodiment of the self-heating battery circuit illustrated in FIGS. 1A and 1B.

A block diagram of an alternative embodiment of the self-heating control circuit 20 is shown in FIG. 2. The block diagram may include a battery management system (BMS) for providing safety limits and measuring various battery parameters including temperature. The BMS may include the computing device 22 (FIGS. 1A and 1B) and be programmed to provide battery management functions, for example, as disclosed in U.S. Pat. No. 6,456,046, hereby incorporated by reference. As well as control the various switches, as discussed above.

Figure 3:
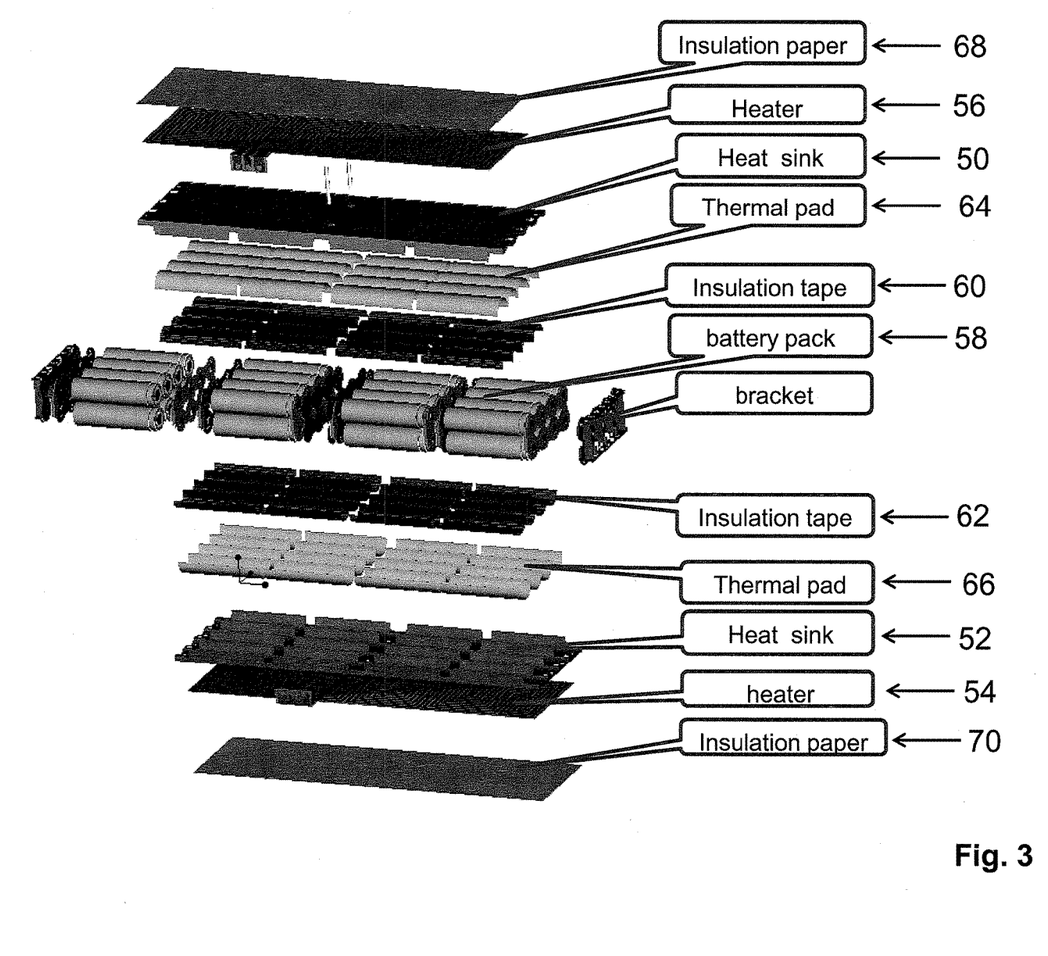
FIG. 3 is an exemplary exploded physical isometric diagram of a core pack which includes batteries and the self-heating battery circuit illustrated in FIGS. 1A and 1B
Figure 4:
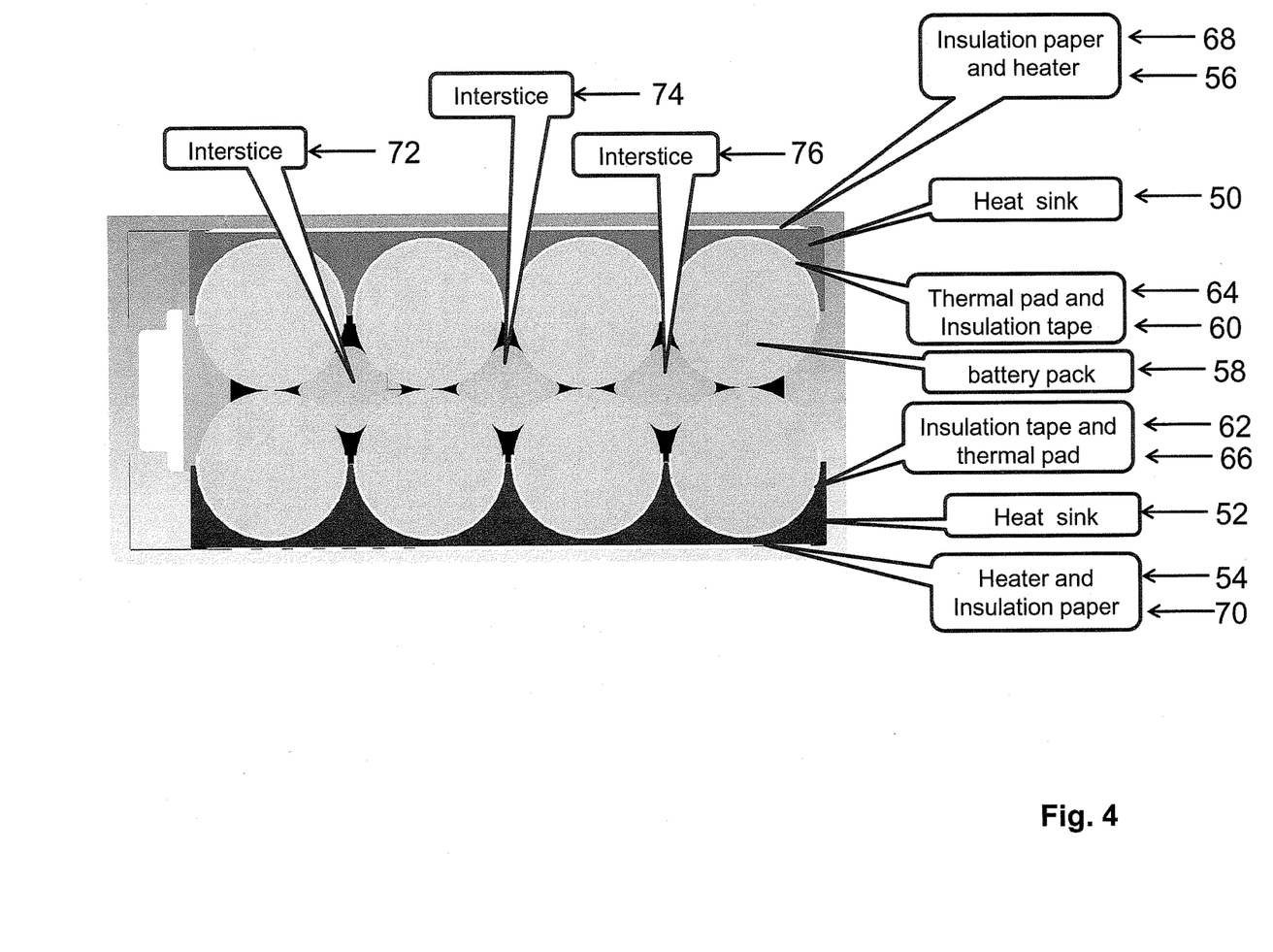
FIG. 4 is an isometric drawing of the core pack illustrated in FIG. 3, shown fully assembled.

FIGS. 3 and 4 illustrate an exemplary physical embodiment of other aspects of the invention. FIG. 3 is an exploded perspective of an exemplary embodiment of the invention. FIG. 4 is a side elevation view of an assembled version of the device illustrated in FIG. 3.

Referring first to FIG. 3. In particular, an important aspect of the invention relates to the use of a heat sink or heat spreader, generally identified with the reference numerals 50 and 52. The heat sinks 50 and 52 are disposed between the heaters 54 and 56 and the battery packs, generally identified with the reference numeral 58. The heat spreaders 50 and 52 have two (2) functions. During a condition when the battery packs 58 are being heated, the heat spreaders 50 and 52 spread the heat among the battery cells to provide uniform heating of the battery cells from the heaters 54, 56 to the battery packs 58.

During a discharge condition, when the battery packs 40 are typically rapidly discharged, 200-300 amps, for example. During such a discharge, the battery packs 58 will heat up significantly. During this condition, the heat sinks 50 and 52 function to channel the heat away from the battery packs 58.

The heat spreader/sinks 50 and 52 may be made from aluminum, for example up to ¼ inch thick or more or other heat conductive materials such as a copper or graphite or various phase change materials. The heat spreader/sinks 50 and 52 may be formed to match the undulating surface of the battery packs 58, as shown in FIG. 3.

The embodiment shown in FIG. 3 is merely exemplary. Multiple battery packs 58 with eight (8) cells each are shown. As shown, each 8 cell pack is in parallel and provides a nominal 3.7 volts DC. The four (4) eight cell packs are connected in series to provide a nominal 14.8 volts DC. Other configurations are contemplated.

In addition, the embodiment in FIG. 3 illustrates two (2) heaters 50 and 54. The invention also contemplates a single heater as illustrated in FIG. 2. Moreover in multi-heater embodiments, the heaters 54 and 56 can have the same or different capacities. For example, one heater may be a high capacity 200 watt or 220 watt heater and the other heater may be a low capacity heater, such as a 30 watt or 45 watt heater. The heaters may be flexible polyimide heaters as manufactured by Watlow, model no. K030050C3-0009B.

In order to provide electrical isolation between the battery packs 58 and the heaters 54 and 56, electrical insulation tape 60 and 62 is provided between the heaters 56 and 54 and the battery packs. Thermally conductive pads 64 and 66 may be provided between the heat sinks 50 and 52 and the insulation tape 60 and 62. Electrical insulation paper 68 and 70 is also provided between the heaters 56 and 54 and an external housing (not shown).

Referring to FIG. 4, one or more rod heaters (not shown) may be disposed in the interstices 72, 74 and 76 of the battery packs 58. For the battery pack 58 shown in FIG. 4, three (3) rod heaters (not shown) may be disposed in the interstices 72, 74 and 76. These rod heaters may be used in lieu of or in addition to the 54 and 56. The rod heaters may be Cal Rod type heaters or Watlow "Firerod" cartridge heaters.

Figure 5:
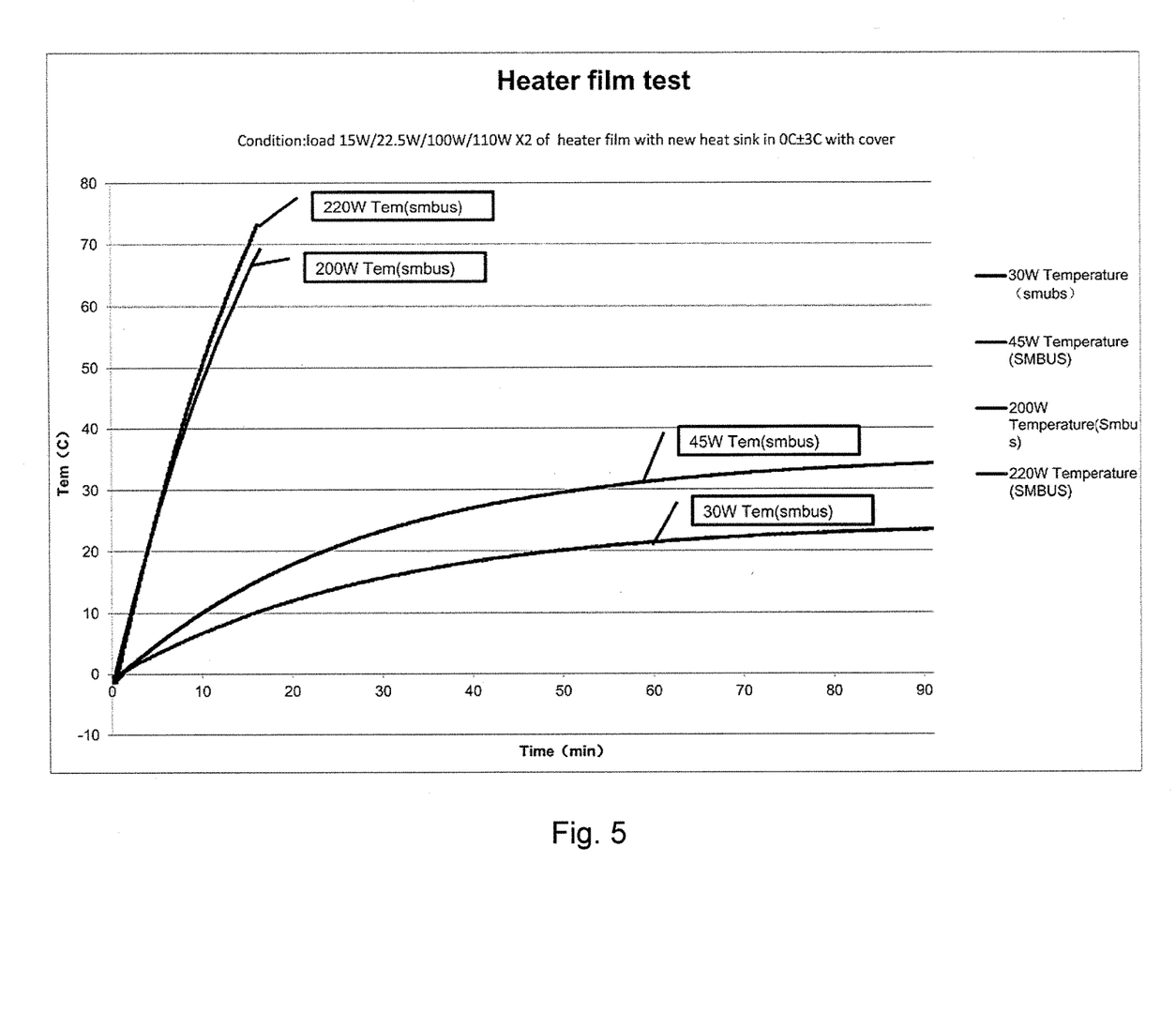
FIG. 5 illustrates several exemplary thermal curves superimposed on a time versus temperature graph illustrating the heater data showing the core pack temperature versus time for 30 W, 45 W, 200 W and 220 W heaters on a 0° C. ambient.
Figure 6:
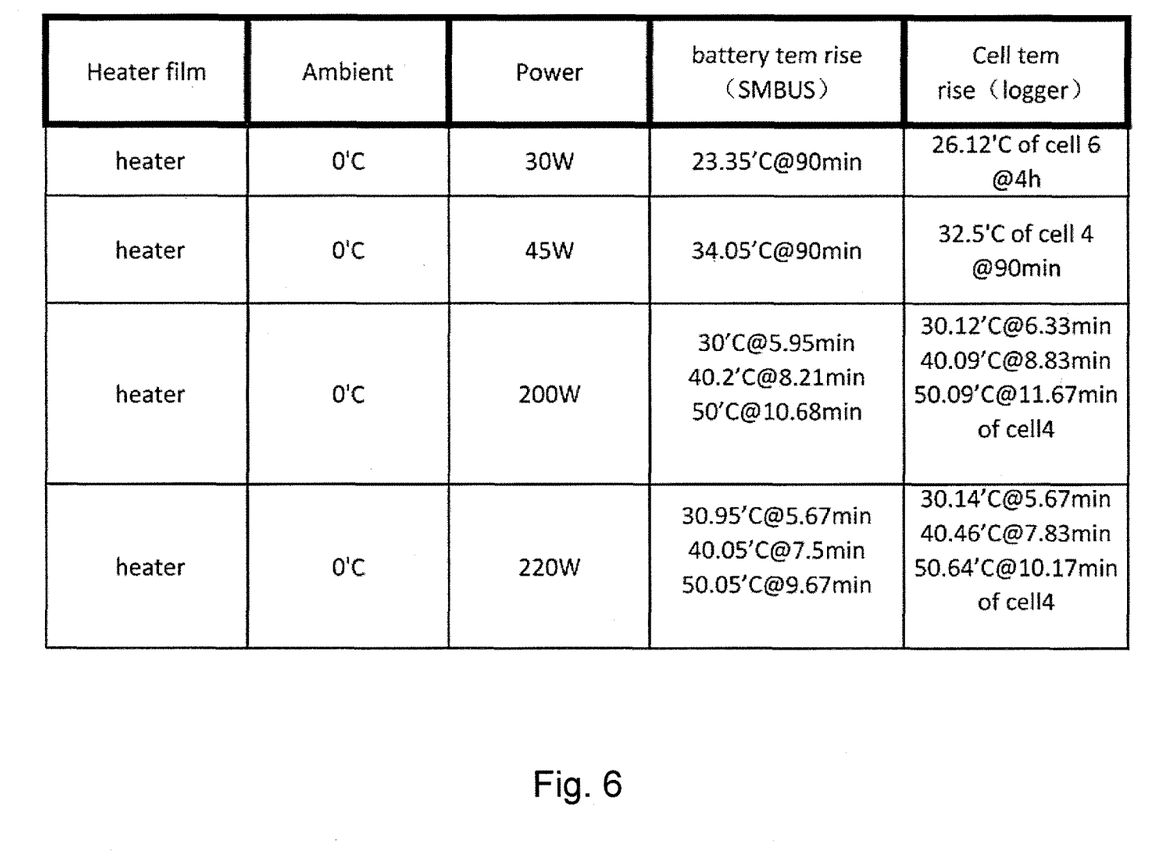
FIG. 6 illustrates a table of exemplary data associated with the thermal curves illustrated in FIG. 5.

FIGS. 5 and 6 illustrate exemplary data regarding the heating of the batteries in a 0° C. ambient. Ideally, the batteries should be brought up to a desired operating temperature of about 25-50° C. As shown and illustrated in FIGS. 5 and 6, thermal curves for the low power 30 watt and 45 watt heaters as well as the high power 200 watt and 220 watt heaters.

In accordance with another aspect of the invention, it is also considered to use the heaters to offset impedance increase of the battery due to aging of the batteries by increasing the desired operating temperature according to in-situ DC resistance measurements taken during use. It is also considered that the DC-resistance measurements be taken using the two different heaters in the invention as the loads necessary to discharge the battery at two different currents for this DC resistance measurement. More specifically, in order to determine the change in the DC-resistance (also referred to as DC impedance) of the battery pack, measurements are taken using the two different heaters of different wattage requirements at the discharge loads necessary to determine the DC resistance. The delta between the voltage points at two different discharge loads are used to determine DC-resistance according to the equation dV/dI=R, where R is the DC resistance.

Obviously, many modifications and variations of the invention are possible in light of the above teachings. Thus, it is to be understood that, within the scope of the appended claims, the invention may be practiced otherwise than as specifically described above.

We claim:

1. A power management circuit for providing backup power to a critical load during various conditions, the power management circuit comprising:
one or more batteries connected in parallel across a pair of load terminals;
a first switch selectively connectable between said load terminals and said one or more batteries to selectively connect said one or more batteries to said load terminals;
a current sensing resistor connected between said one or more batteries and said load terminals for sensing the charging current and discharging current provided to said one or more batteries;
a battery charger for charging said one or more batteries;
a primary power input terminal connected to said battery charger;
a second switch connected between said battery charger and said batteries to allow said battery charger to selectively be connected to said one or more batteries;
one or more heaters selectively connectable to said battery charger for enabling said battery charger to power said one or more heaters;
a temperature sensor for sensing ambient temperature of the batteries; and
a computing device for determining the state of charge of the batteries from the charging current, the discharging current and battery voltage, and controlling said first switch as a function of the state of charge of said batteries, said power management circuit configured to enable said battery charger to charge the batteries and power a heater at a same time.

2. The power management circuit as recited in claim 1, wherein said power management circuit is further configured to enable a residual capacity in said batteries to boost power provided to said one or more heaters.

3. The power management circuit as recited in claim 1, further comprising:
a first thermally conductive material in contact with said one or more battery cells; and
at least one heater, wherein said at least one heater is in contact with said thermally conductive material, said one or more battery cells, said first thermally conductive material and said at least one heater carried in a common housing.

4. A power management system comprising:
one or more battery cells selectively connectable to a pair of load terminals;
a battery charger selectively connectable to said one or more battery cells;
a temperature sensor for sensing temperature of said one or more battery cells; and
one or more heaters selectively connectable to said battery charger; said power management system further configured to enable multiple modes of operation, wherein in a first mode, the battery charger maintains charge on said one or more battery cells and powers said one or more heaters to maintain the temperature of said one or more battery cells at a predetermined value and in a boost mode charges said one or more battery cells and enables a residual capacity of said one or more battery cells to boost the power supplied to said one or more heaters as a function of the temperature of said one or more battery cells.

5. The power management system as recited in claim 4, wherein said power management system is configured to determine state of charge of said one or more battery cells and to charge said one or more battery cells in said first mode of operation as a function of the state of charge of said one or more battery cells.

6. The power management system as recited in claim 5, wherein said power management system is configured to charge said one or more battery cells in said first mode of operation as a function of the state of charge of said one or more battery cells.

7. The power management circuit as recited in claim 4, further comprising:
- a first thermally conductive material in contact with said one or more battery cells; and
- at least one heater, wherein said at least one heater is in contact with said thermally conductive material, said one or more battery cells, said first thermally conductive material and said at least one heater carried in a common housing.

8. A method for heating a battery from a primary source of power with one or more heaters; the method comprising:
- powering said one or more heaters from said primary source of power in a first mode of operation as a function of temperature of the battery; and
- powering said one or more heaters from said primary source of power and a residual capacity in said battery in a second mode of operation.

9. The method as recited in claim 8, further including a step of charging said battery by way of a battery charger which also acts as the primary power source.

10. A battery pack comprising:
- a plurality of battery cells;
- at least one rod heater disposed in contact with said plurality of battery cells; and
- a thermally conductive material in thermal contact with said plurality of battery cells, wherein said plurality of battery cells, said thermally conductive material and said at least one rod heater are carried in a common housing.

* * * * *